(12) United States Patent
Nguyen et al.

(10) Patent No.: US 12,362,267 B2
(45) Date of Patent: Jul. 15, 2025

(54) ELECTRONIC PACKAGE AND METHOD FOR MANUFACTURING AN ELECTRONIC PACKAGE

(71) Applicant: Skyworks Solutions, Inc., Irvine, CA (US)

(72) Inventors: Hoang Mong Nguyen; Anthony James LoBianco, Irvine, CA (US); Howard E. Chen, Anaheim, CA (US); Ki Wook Lee, Irvine, CA (US); Yi Liu, San Diego, CA (US)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 0 days.

(21) Appl. No.: 17/504,911

(22) Filed: Oct. 19, 2021

(65) Prior Publication Data
US 2023/0115846 A1    Apr. 13, 2023

Related U.S. Application Data

(60) Provisional application No. 63/255,187, filed on Oct. 13, 2021.

(51) Int. Cl.
*H01L 23/498* (2006.01)
*H01L 21/48* (2006.01)
(Continued)

(52) U.S. Cl.
CPC .... *H01L 23/49811* (2013.01); *H01L 21/4853* (2013.01); *H01L 21/565* (2013.01);
(Continued)

(58) Field of Classification Search
None
See application file for complete search history.

(56) References Cited

U.S. PATENT DOCUMENTS

| 7,198,987 B1 | 4/2007 | Warren et al. |
| 7,445,968 B2 | 11/2008 | Harrison et al. |

(Continued)

FOREIGN PATENT DOCUMENTS

| DE | 10 2016 100 523 | * | 4/2018 |
| GB | 2606631 | | 11/2022 |

(Continued)

*Primary Examiner* — Long Pham
(74) *Attorney, Agent, or Firm* — Knobbe, Martens, Olson & Bear LLP

(57) ABSTRACT

An electronic package is provided. The electronic package comprises a substrate having a first side and a second side, the substrate configured to receive one or more electronic components; a first electronic component mounted to the first side of the substrate; a first mold structure extending over at least part of the first side of the substrate; a group of through-mold connections provided on the first side of the substrate, the through-mold connections substantially formed of non-reflowable electrically conductive material; the first mold structure substantially encapsulating the group of through-mold connections; the group of through-mold connections exposed through the first mold structure. An electronic device comprising such an electronic package is also provided. A method of manufacturing such an electronic package is also provided.

16 Claims, 12 Drawing Sheets

(51) Int. Cl.
  *H01L 21/56* (2006.01)
  *H01L 23/31* (2006.01)
  *H01L 25/00* (2006.01)
  *H01L 25/10* (2006.01)
(52) U.S. Cl.
  CPC .... *H01L 23/3121* (2013.01); *H01L 23/49866* (2013.01); *H01L 25/105* (2013.01); *H01L 25/50* (2013.01)

(56) References Cited

U.S. PATENT DOCUMENTS

| | | |
|---|---|---|
| 7,958,629 B2 | 6/2011 | Thompson et al. |
| 8,058,714 B2 | 11/2011 | Noll et al. |
| 8,071,431 B2 | 12/2011 | Hoang et al. |
| 8,399,972 B2 | 3/2013 | Hoang et al. |
| 8,832,931 B2 | 9/2014 | Thompson et al. |
| 8,948,712 B2 | 2/2015 | Chen et al. |
| 9,041,168 B2 | 5/2015 | Hoang et al. |
| 9,041,472 B2 | 5/2015 | Chen et al. |
| 9,054,115 B2 | 6/2015 | Hoang et al. |
| 9,071,335 B2 | 6/2015 | Agarwal et al. |
| 9,202,747 B2 | 12/2015 | Chen et al. |
| 9,202,748 B2 | 12/2015 | Lobianco et al. |
| 9,203,529 B2 | 12/2015 | Chen et al. |
| 9,214,387 B2 | 12/2015 | Chen et al. |
| 9,252,107 B2 | 2/2016 | Read et al. |
| 9,295,157 B2 | 3/2016 | Chen et al. |
| 9,419,667 B2 | 8/2016 | Lobianco et al. |
| 9,506,968 B2 | 11/2016 | Hoang et al. |
| 9,515,029 B2 | 12/2016 | Chen et al. |
| 9,576,911 B2 | 2/2017 | Lobianco et al. |
| 9,646,936 B2 | 5/2017 | Chen et al. |
| 9,653,409 B2 | 5/2017 | Read et al. |
| 9,703,913 B2 | 7/2017 | Chen et al. |
| 9,754,896 B2 | 9/2017 | Read et al. |
| 9,871,599 B2 | 1/2018 | Chen et al. |
| 10,043,763 B2 | 8/2018 | Chen |
| 10,061,885 B2 | 8/2018 | Chen et al. |
| 10,062,670 B2 | 8/2018 | Frenette et al. |
| 10,163,814 B2 | 12/2018 | Read et al. |
| 10,192,785 B2 | 1/2019 | Liu et al. |
| 10,200,077 B2 | 2/2019 | Liu et al. |
| 10,242,143 B2 | 3/2019 | Chen et al. |
| 10,256,535 B2 | 4/2019 | Nguyen et al. |
| 10,269,769 B2 | 4/2019 | Frenette et al. |
| 10,276,521 B2 | 4/2019 | Babcock et al. |
| 10,283,859 B2 | 5/2019 | Nguyen et al. |
| 10,290,585 B2 | 5/2019 | Nguyen et al. |
| 10,320,071 B2 | 6/2019 | Nguyen et al. |
| 10,340,225 B2 | 7/2019 | Chen |
| 10,349,568 B2 | 7/2019 | Thompson et al. |
| 10,361,145 B2 | 7/2019 | Chen et al. |
| 10,410,885 B2 | 9/2019 | Darveaux |
| 10,446,524 B2 | 10/2019 | Frenette et al. |
| 10,460,957 B2 | 10/2019 | Darveaux |
| 10,497,656 B2 | 12/2019 | Chen et al. |
| 10,515,924 B2 | 12/2019 | Babcock et al. |
| 10,524,350 B2 | 12/2019 | Lobianco et al. |
| 10,529,669 B2 | 1/2020 | Nguyen et al. |
| 10,530,050 B2 | 1/2020 | Nguyen et al. |
| 10,579,766 B2 | 3/2020 | Chen et al. |
| 10,580,741 B2 | 3/2020 | Read et al. |
| 10,586,010 B2 | 3/2020 | Chen et al. |
| 10,593,565 B2 | 3/2020 | Darveaux |
| 10,607,944 B2 | 3/2020 | Chen et al. |
| 10,615,841 B2 | 4/2020 | Liu et al. |
| 10,770,312 B2 | 9/2020 | Darveaux |
| 10,797,002 B2 | 10/2020 | Nguyen et al. |
| 10,854,559 B2 | 12/2020 | Chen |
| 10,931,009 B2 | 2/2021 | Nguyen et al. |
| 10,980,106 B2 | 4/2021 | Lobianco et al. |
| 11,037,893 B2 | 6/2021 | Wallis et al. |
| 11,038,266 B2 * | 6/2021 | Khoury .................. H01Q 1/526 |
| 11,038,267 B2 | 6/2021 | Lobianco et al. |
| 11,043,466 B2 | 6/2021 | Babcock et al. |
| 11,063,002 B2 | 7/2021 | Nguyen et al. |
| 11,069,978 B2 | 7/2021 | Hoang et al. |
| 11,088,112 B2 | 8/2021 | Frenette et al. |
| 11,127,690 B2 | 9/2021 | Chen et al. |
| 11,139,257 B2 | 10/2021 | Chen et al. |
| 11,552,393 B2 * | 1/2023 | Khoury ................ H01Q 1/2283 |
| 2005/0011672 A1 | 1/2005 | Alawani et al. |
| 2007/0138614 A1 | 6/2007 | Harrison et al. |
| 2007/0241440 A1 | 10/2007 | Hoang et al. |
| 2008/0112151 A1 | 5/2008 | Thompson et al. |
| 2008/0315396 A1 | 12/2008 | Kuhlman et al. |
| 2009/0249619 A1 | 10/2009 | Thompson et al. |
| 2010/0073255 A1 | 3/2010 | Noll et al. |
| 2011/0084368 A1 | 4/2011 | Hoang et al. |
| 2012/0036710 A1 | 2/2012 | Thompson et al. |
| 2012/0137514 A1 | 6/2012 | Hoang et al. |
| 2012/0146178 A1 | 6/2012 | Hoang et al. |
| 2013/0021219 A1 | 1/2013 | Agarwal et al. |
| 2013/0095610 A1 * | 4/2013 | Chau .................. H01L 23/3677 438/109 |
| 2013/0323408 A1 | 12/2013 | Read et al. |
| 2013/0323409 A1 | 12/2013 | Read et al. |
| 2013/0324069 A1 | 12/2013 | Chen et al. |
| 2013/0335288 A1 | 12/2013 | Read et al. |
| 2014/0002188 A1 | 1/2014 | Chen et al. |
| 2014/0016277 A1 | 1/2014 | Chen et al. |
| 2014/0077361 A1 | 3/2014 | Lin et al. |
| 2014/0083459 A1 | 3/2014 | Read et al. |
| 2014/0087633 A1 | 3/2014 | Read et al. |
| 2014/0091813 A1 | 4/2014 | Hoang et al. |
| 2014/0167232 A1 | 6/2014 | Lobianco et al. |
| 2014/0175621 A1 | 6/2014 | Chen et al. |
| 2014/0175622 A1 | 6/2014 | Chen et al. |
| 2014/0307394 A1 | 10/2014 | Lobianco et al. |
| 2015/0070861 A1 | 3/2015 | Thompson et al. |
| 2015/0126139 A1 | 5/2015 | Chen et al. |
| 2015/0255402 A1 | 9/2015 | Hoang et al. |
| 2015/0255403 A1 | 9/2015 | Hoang et al. |
| 2015/0326181 A1 | 11/2015 | Chen et al. |
| 2015/0326182 A1 | 11/2015 | Chen et al. |
| 2015/0326183 A1 | 11/2015 | Chen et al. |
| 2016/0014935 A1 | 1/2016 | Agarwal et al. |
| 2016/0035593 A1 | 2/2016 | Read et al. |
| 2016/0035679 A1 | 2/2016 | Chen et al. |
| 2016/0043813 A1 | 2/2016 | Chen et al. |
| 2016/0044842 A1 | 2/2016 | Chen et al. |
| 2016/0049374 A1 | 2/2016 | Lobianco et al. |
| 2016/0064337 A1 | 3/2016 | Chen et al. |
| 2016/0099192 A1 | 4/2016 | Chen et al. |
| 2016/0162620 A1 | 6/2016 | Chen et al. |
| 2016/0163661 A1 | 6/2016 | Chen et al. |
| 2016/0181206 A1 | 6/2016 | Read et al. |
| 2017/0025362 A1 | 1/2017 | Nguyen et al. |
| 2017/0042069 A1 | 2/2017 | Lobianco et al. |
| 2017/0117184 A1 | 4/2017 | Liu et al. |
| 2017/0179039 A1 | 6/2017 | Lee et al. |
| 2017/0221836 A1 | 8/2017 | Nguyen et al. |
| 2017/0236785 A1 | 8/2017 | Chen et al. |
| 2017/0301629 A1 | 10/2017 | Read et al. |
| 2017/0301630 A1 | 10/2017 | Nguyen et al. |
| 2017/0301653 A1 | 10/2017 | Frenette et al. |
| 2017/0301654 A1 | 10/2017 | Frenette et al. |
| 2017/0301985 A1 | 10/2017 | Nguyen et al. |
| 2017/0301986 A1 | 10/2017 | Nguyen et al. |
| 2017/0302325 A1 | 10/2017 | Frenette et al. |
| 2017/0317710 A1 | 11/2017 | Liu et al. |
| 2017/0324160 A1 * | 11/2017 | Khoury .................. H01Q 1/526 |
| 2017/0337317 A1 | 11/2017 | Chen et al. |
| 2018/0019212 A1 | 1/2018 | Read et al. |
| 2018/0076148 A1 | 3/2018 | Nguyen et al. |
| 2018/0096949 A1 | 4/2018 | Chen et al. |
| 2018/0096950 A1 | 4/2018 | Chen et al. |
| 2018/0096951 A1 | 4/2018 | Chen et al. |
| 2018/0198436 A1 | 7/2018 | Joshi |
| 2018/0218922 A1 | 8/2018 | Darveaux |
| 2018/0226271 A1 | 8/2018 | Chen et al. |
| 2018/0226272 A1 | 8/2018 | Darveaux |
| 2018/0226273 A1 | 8/2018 | Darveaux et al. |

(56) References Cited

U.S. PATENT DOCUMENTS

| | | |
|---|---|---|
| 2018/0226274 A1 | 8/2018 | Darveaux |
| 2018/0226361 A1 | 8/2018 | Chen et al. |
| 2018/0226367 A1 | 8/2018 | Babcock et al. |
| 2018/0233423 A1 | 8/2018 | Lobianco et al. |
| 2018/0240763 A1 | 8/2018 | Chen et al. |
| 2018/0261566 A1 | 9/2018 | Babcock et al. |
| 2018/0294558 A1 | 10/2018 | Hoang et al. |
| 2018/0294568 A1 | 10/2018 | Hoang et al. |
| 2018/0294569 A1 | 10/2018 | Hoang et al. |
| 2018/0315716 A1 | 11/2018 | Chen |
| 2018/0315717 A1 | 11/2018 | Nguyen et al. |
| 2018/0365365 A1 | 12/2018 | Chen et al. |
| 2019/0043837 A1 | 2/2019 | Frenette et al. |
| 2019/0057929 A1 | 2/2019 | Chen et al. |
| 2019/0171785 A1 | 6/2019 | Chen et al. |
| 2019/0181906 A1 | 6/2019 | Liu et al. |
| 2019/0198451 A1 | 6/2019 | Read et al. |
| 2019/0198990 A1 | 6/2019 | Nguyen et al. |
| 2019/0214300 A1 | 7/2019 | Liu et al. |
| 2019/0341687 A1 | 11/2019 | Nguyen et al. |
| 2019/0394912 A1 | 12/2019 | Thompson et al. |
| 2020/0044332 A1 | 2/2020 | Lobianco et al. |
| 2020/0058619 A1 | 2/2020 | Frenette et al. |
| 2020/0075349 A1 | 3/2020 | Darveaux |
| 2020/0075504 A1 | 3/2020 | Nguyen et al. |
| 2020/0107433 A1 | 4/2020 | Vijayakumar et al. |
| 2020/0152483 A1 | 5/2020 | Darveaux |
| 2020/0161222 A1 | 5/2020 | Chen et al. |
| 2020/0161254 A1 | 5/2020 | Chen |
| 2020/0227364 A1 | 7/2020 | Chen et al. |
| 2020/0229298 A1 | 7/2020 | Lobianco et al. |
| 2020/0258845 A1 | 8/2020 | Nguyen et al. |
| 2020/0279825 A1 | 9/2020 | Babcock et al. |
| 2020/0321287 A1 | 10/2020 | Chen et al. |
| 2020/0357756 A1 | 11/2020 | Wallis et al. |
| 2021/0143024 A1 | 5/2021 | Darveaux |
| 2021/0143542 A1 | 5/2021 | Nguyen et al. |
| 2021/0217714 A1 | 7/2021 | Soliman et al. |
| 2021/0320081 A1* | 10/2021 | Babcock ............... H01L 25/16 |
| 2023/0402293 A1 | 12/2023 | Lobianco et al. |
| 2023/0402294 A1 | 12/2023 | Lobianco et al. |
| 2023/0402338 A1 | 12/2023 | Lobianco et al. |

FOREIGN PATENT DOCUMENTS

| | | |
|---|---|---|
| WO | WO 2013/059181 | 4/2013 |
| WO | WO2018/067578 A1 | 4/2018 |

* cited by examiner

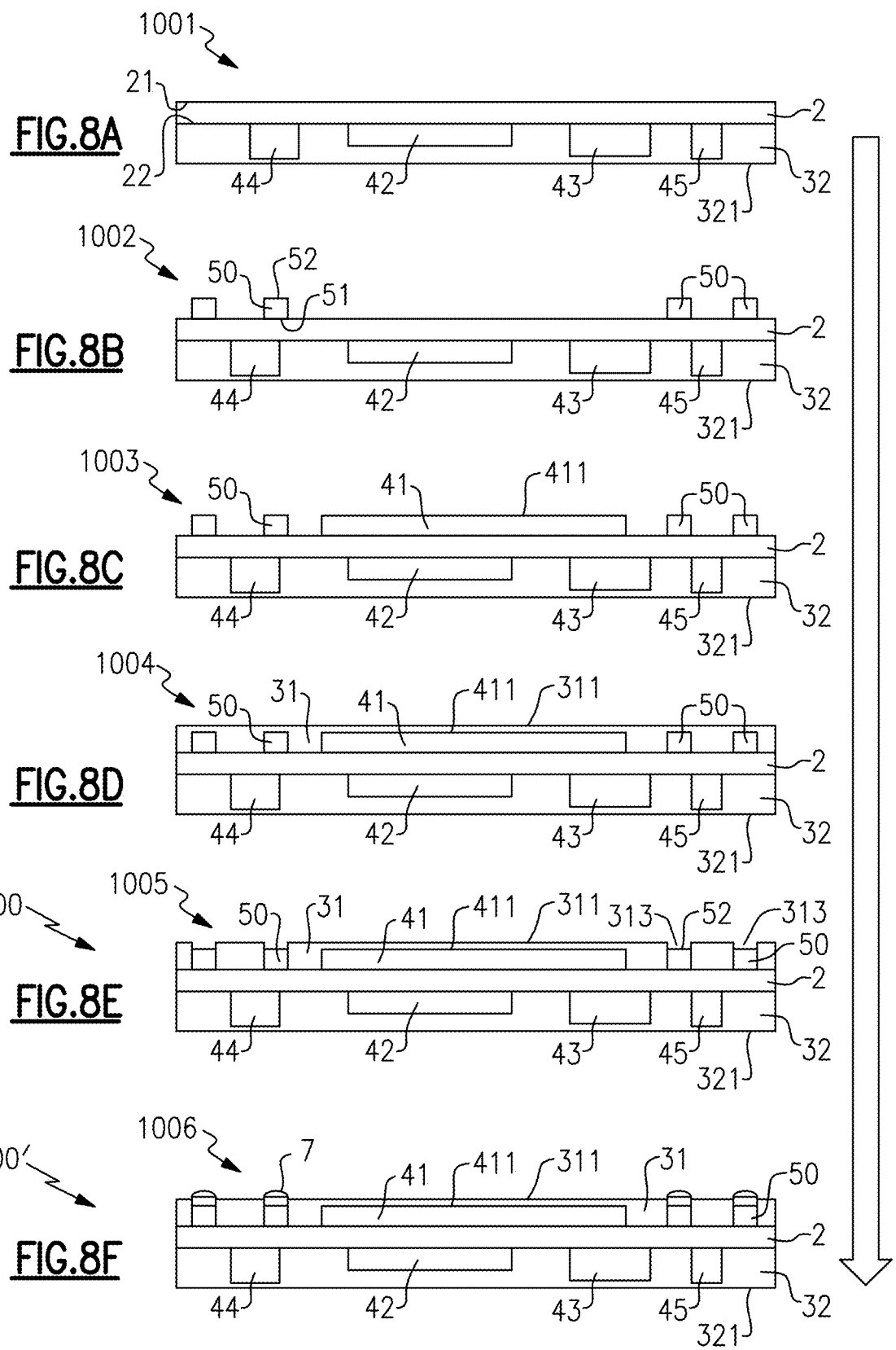

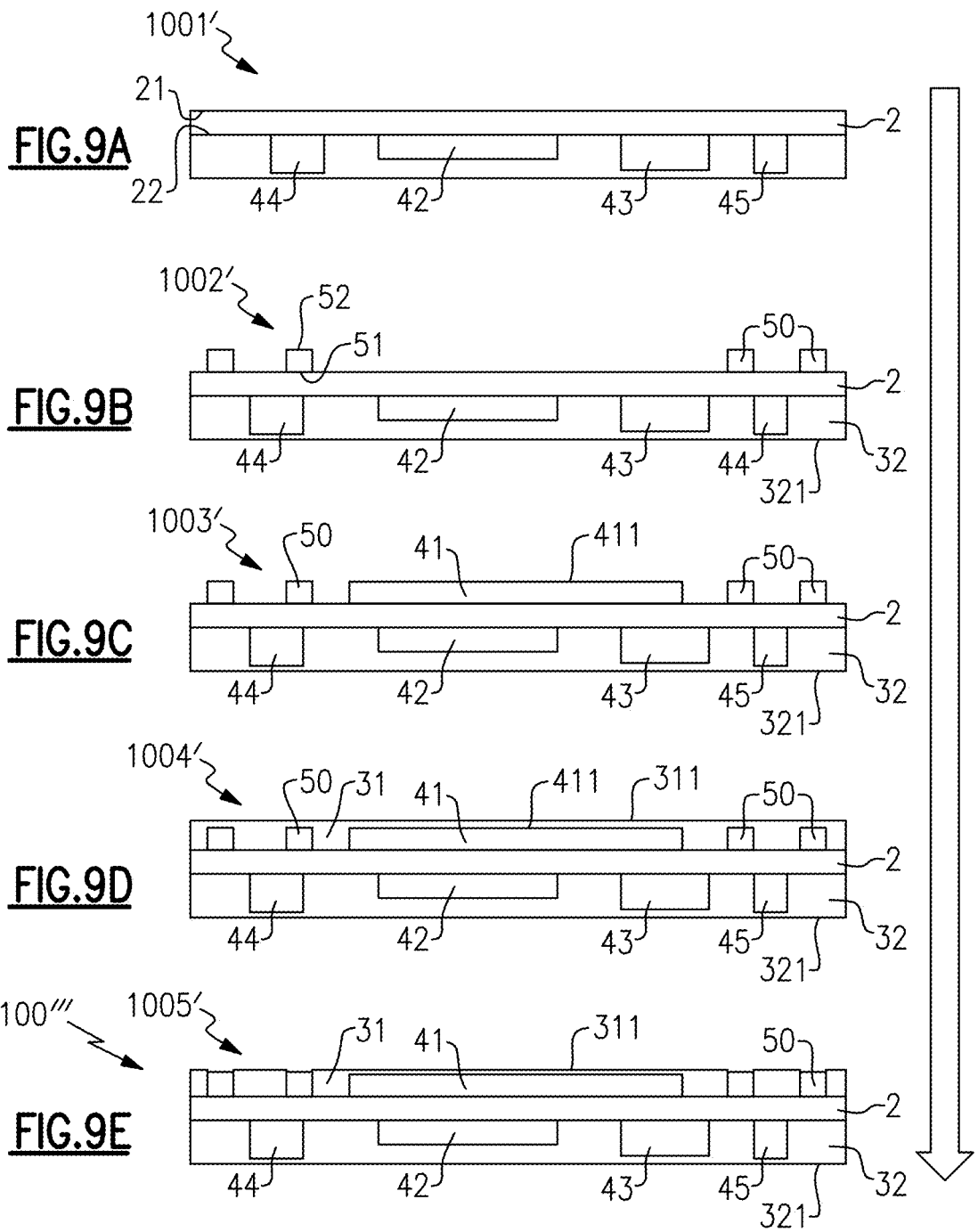

ELECTRONIC PACKAGE AND METHOD FOR MANUFACTURING AN ELECTRONIC PACKAGE

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

BACKGROUND

Field

The present disclosure relates to electronic packages suitable for coupling to a circuit board. The present disclosure also relates to an electronic device incorporating such an electronic package. The present disclosure also relates to a method of manufacturing such an electronic package.

Description of the Related Technology

Conventional electronic packages have a substrate, with one or more electronic components or modules mounted to at least one side of the substrate. The electronic components/modules are mounted to the substrate by known methods of surface mounting technology. An array of solder balls is arranged on a first side of the substrate to surround an electronic component/module mounted to the substrate. A mold structure is applied over the first side of the substrate to fully encapsulate the array of solder balls and the electronic component/module under an outer surface of the mold structure. A grinding or similar operation is subsequently performed on the outer surface of the mold structure to expose the array of solder balls. Laser ablation or a similar process is also performed to locally remove mold material in the vicinity of each of the array of solder balls, to define a moat or channel circumscribing each of the solder balls. The grinding and ablation operations may deform the solder balls and/or remove material from the solder balls. The resulting electronic package may then be coupled to a circuit board by soldering the array of solder balls of the electronic package to corresponding mounting locations on the circuit board.

SUMMARY

According to one embodiment there is provided an electronic package, comprising: a substrate having a first side and a second side, the substrate configured to receive one or more electronic components; a first electronic component mounted to the first side of the substrate; a first mold structure extending over at least part of the first side of the substrate; a group of through-mold connections provided on the first side of the substrate, the through-mold connections substantially formed of a non-reflowable electrically conductive material; the first mold structure substantially encapsulating the group of through-mold connections; the group of through-mold connections exposed through the first mold structure.

In one example the first mold structure encapsulates at least part of the first electronic component.

In one example the electronic package further comprises a second electronic component mounted to the second side of the substrate; and a second mold structure extending over at least part of the second side of the substrate. In one example the second mold structure encapsulates at least part of the second electronic component.

In one example the non-reflowable electrically conductive material has a melting point of greater than 400 degrees Celsius, or greater than 500 degrees Celsius, or greater than 600 degrees Celsius, or greater than 700 degrees Celsius, or greater than 800 degrees Celsius, or greater than 900 degrees Celsius. In one example the non-reflowable electrically conductive material comprises or consists of any one or more of copper, nickel, gold and silver.

In one example the non-reflowable electrically conductive material comprises or consists of any one or more of tin, antimony and palladium.

In one example the non-reflowable electrically conductive material is formed of a non-solder material.

In one example the non-reflowable electrically conductive material is configured for soldering thereto.

In one example at least one of the group of through-mold connections is hollow. In one example a filler is provided inside of the hollow through-mold connection. In one example the filler comprises a plastic.

In one example an outer surface of the first mold structure is free of any moat or channel circumscribing and adjacent to each of the through-mold connections.

In one example at least one of the group of through-mold connections is recessed in a corresponding well defined in the first mold structure, a surface of the through-mold connection exposed by the well to define an exposed surface of the through-mold connection. In one example the well has a substantially uniform cross-sectional area along a depth of the well, the substantially uniform cross-sectional area substantially the same as the area of the exposed surface of the corresponding through-mold connection. In one example the electronic package further comprises a solder portion coupled to the exposed surface of at least one of the group of through-mold connections, the solder portion protruding from the corresponding well.

In one example an exposed surface of at least one of the group of through-mold connections is substantially flush with an outer surface of the first mold structure. In one example the exposed surface of the at least one of the group of through-mold connections and the outer surface of the first mold structure collectively define a planar surface. In one example the electronic package further comprises a solder portion coupled to the exposed surface of the at least one of the group of through-mold connections, the solder portion protruding from the first mold structure.

In one example the group of through-mold connections comprises a group of pillars, each pillar extending away from the first side of the substrate. In one example the group of through-mold connections further comprises a group of first flanges, each first flange disposed on a first end of a corresponding one of the group of pillars and arranged on the first side of the substrate such that the pillar extends away from the first side of the substrate. In one example corresponding ones of the group of pillars and the group of first flanges are integrally formed as a single piece. In one example the group of through-mold connections further comprises a group of second flanges, each second flange disposed on a second end of a corresponding one of the group of pillars opposite to the first end, the second flange exposed through the first mold structure. In one example corresponding ones of the group of pillars and the group of second flanges are integrally formed as a single piece.

In one example the group of through-mold connections comprise a group of ellipsoids, spheres, or a combination thereof.

In one example at least one of the group of through-mold connections is coupled to a corresponding electrically conductive node provided on or embedded in the substrate. In one example the electrically conductive node comprises an electrically conductive pad provided on or embedded in the substrate. In one example the electrically conductive pad is soldered to the corresponding through-mold connection. In one example the electrically conductive pad and the corresponding through-mold connection are integrally formed as a single piece from the non-reflowable electrically conductive material.

In one example the group of through-mold connections substantially surround the first electronic component. In one example the group of through-mold connections comprise a first sub-group of through-mold connections and a second sub-group of through-mold connections, the first sub-group substantially surrounding the second sub-group.

According to another embodiment there is provided an electronic device, comprising: a circuit board configured to receive one or more electronic packages; and an electronic package mounted to the circuit board; the electronic package comprising: a substrate having a first side and a second side, the substrate configured to receive one or more electronic components; a first electronic component mounted to the first side of the substrate; a first mold structure extending over at least part of the first side of the substrate; a group of through-mold connections provided on the first side of the substrate, the through-mold connections substantially formed of a non-reflowable electrically conductive material; the first mold structure substantially encapsulating the group of through-mold connections; the group of through-mold connections exposed through the first mold structure.

In one example the electronic device is a wireless mobile device.

According to another embodiment there is provided a method for manufacturing an electronic package, the method comprising steps of: providing a substrate having a first side and a second side, the substrate configured to receive one or more electronic components; arranging a group of through-mold connections on the first side of the substrate, the through-mold connections substantially formed of a non-reflowable electrically conductive material; mounting a first electronic component to the first side of the substrate; applying a first mold structure to the first side of the substrate such that the first mold structure extends over at least part of the first side of the substrate and substantially encapsulates the group of through-mold connections; and removing a portion of the first mold structure to expose the group of through-mold connections.

In one example the step of applying a first mold structure to the first side of the substrate comprises encapsulating at least part of the first electronic component in the first mold structure.

In one example the method further comprises steps of: mounting a second electronic component to the second side of the substrate; and applying a second mold structure to the second side of the substrate such that the second mold structure extends over at least part of the second side of the substrate. In one example the step of applying a second mold structure to the second side of the substrate comprises encapsulating at least part of the second electronic component in the second mold structure.

In one example the non-reflowable electrically conductive material has a melting point of greater than 400 degrees Celsius, or greater than 500 degrees Celsius, or greater than 600 degrees Celsius, or greater than 700 degrees Celsius, or greater than 800 degrees Celsius, or greater than 900 degrees Celsius. In one example the non-reflowable electrically conductive material comprises or consists of any one or more of copper, nickel, gold and silver.

In one example the non-reflowable electrically conductive material comprises or consists of any one or more of tin, antimony and palladium.

In one example the non-reflowable electrically conductive material is formed of a non-solder material.

In one example the non-reflowable electrically conductive material is configured for soldering thereto.

In one example at least one of the group of through-mold connections is hollow. In one example a filler is provided inside of the hollow through-mold connection. In one example the filler comprises a plastic.

In one example the step of removing a portion of the first mold structure to expose the group of through-mold connections is such that an outer surface of the first mold structure is free of any moat or channel circumscribing and adjacent to each of the through-mold connections.

In one example the step of removing a portion of the first mold structure comprises ablating an outer surface of the first mold structure. In one example the ablating the outer surface of the first mold structure comprises one or more of laser ablating and grinding.

In one example the step of removing a portion of the first mold structure comprises removing material of the first mold structure to form at least one well in the first mold structure such that a surface of a corresponding one of the group of through-mold connections is exposed by and recessed within the well. In one example the removing material of the first mold structure to form the well in the mold structure comprises forming the well to have a substantially uniform cross-sectional area along a depth of the well, the substantially uniform cross-sectional area substantially the same as the area of the exposed surface of the corresponding through-mold connection. In one example the method further comprises a step of coupling a solder portion to the exposed surface of at least one of the group of through-mold connections such that the solder portion protrudes from the well.

In one example the step of removing a portion of the first mold structure comprises removing material of the first mold structure such that an exposed surface of at least one of the group of through-mold connections is substantially flush with an outer surface of the first mold structure. In one example the step of removing a portion of the first mold structure is such that the exposed surface of the at least one of the group of through-mold connections and the outer surface of the first mold structure collectively define a planar surface. In one example the method further comprises a step of coupling a solder portion to the exposed surface of the at least one of the group of through-mold connections such that the solder portion protrudes from the first mold structure.

In one example the group of through-mold connections comprises a group of pillars, the step of arranging a group of through-mold connections on the first side of the substrate comprising arranging each pillar of the group of pillars to extend away from the first side of the substrate. In one example the group of through-mold connections further comprises a group of first flanges, each first flange disposed on a first end of a corresponding one of the group of pillars, the step of arranging a group of through-mold connections on the first side of the substrate further comprising arranging each first flange on the first side of the substrate such that the pillar extends away from the first side of the substrate. In one example corresponding ones of the group of pillars and the group of first flanges are integrally formed as a single piece.

In one example the group of through-mold connections further comprises a group of second flanges, each second flange disposed on a second end of a corresponding one of the group of pillars opposite to the first end, the step of removing a portion of the first mold structure to expose the group of through-mold connections comprising exposing the second flange through the first mold structure. In one example corresponding ones of the groups of pillars and the group of second flanges are integrally formed as a single piece.

In one example the group of through-mold connections comprises a group of ellipsoids, spheres, or a combination thereof.

In one example the step of arranging the group of through-mold connections on the first side of the substrate comprises coupling at least one of the group of through-mold connections to a corresponding electrically conductive node provided on or embedded in the substrate. In one example the electrically conductive node comprises an electrically conductive pad provided on or embedded in the substrate. In one example the step of arranging the group of through-mold connections on the first side of the substrate further comprises soldering the electrically conductive pad to the corresponding through-mold connection. In one example the electrically conductive pad and the corresponding through-mold connection are integrally formed as a single piece from the non-reflowable electrically conductive material.

In one example the group of through-mold connections substantially surround the first electronic component.

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures:

FIGS. 8A-F illustrate a first example of fabrication steps of a method of manufacturing an electronic package according to aspects of the present disclosure.

FIGS. 9A-E illustrate a second example of fabrication steps of a method of manufacturing an electronic package according to aspects of the present disclosure.

DETAILED DESCRIPTION

Aspects and embodiments described herein are directed to an electronic package, preferably a dual-sided electronic package, for coupling to a separate circuit board. In particular, aspects and embodiments described herein provide an alternative to the use of an array of solder balls to facilitate coupling of the electronic package to such a separate circuit board. The alternative to the use of an array of solder balls may provide improved dimensional stability when heated, as well as providing improved mechanical performance when the electronic package is subjected to impact forces encountered during validation testing, transport, or during operational use of the package. Fabrication of the electronic package may require fewer discrete manufacturing steps, thereby potentially reducing the time and cost of manufacturing each individual electronic package.

It is to be appreciated that embodiments of the packages, devices and methods discussed herein are not limited in application to the details of construction and the arrangement of components set forth in the following description or illustrated in the accompanying drawings. The packages, devices and methods are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms.

FIGS. 1A-D show a cross-sectional view of a strip of individual electronic packages 10 of the background art, at various stages of fabrication. Each strip contains multiple electronic packages or units 10. The dashed line in FIGS. 1A-D indicates the boundary between adjacent electronic packages 10.

Figure 1A:
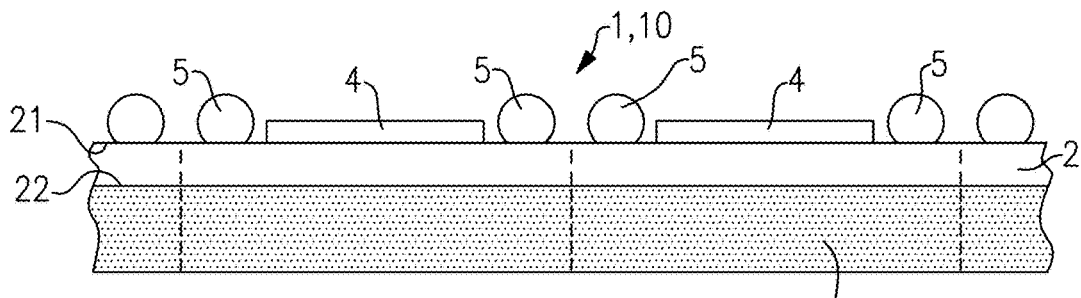
FIGS. 1A-D are cross-sectional schematic views of a strip of electronic packages according to the background art, at various stages of fabrication.

FIG. 1A shows a fabrication state in which a strip 1 is provided, the strip 1 including a substrate panel 2 with an upper-facing side 21 and a lower-facing side 22. The upper-facing and lower-facing sides 21, 22 form opposing surfaces of the substrate panel 2. The terms "upper" and "lower" are used here only to indicate the relative disposition of the different sides of the substrate panel 2 shown in FIGS. 1A-D, with it being appreciated that during fabrication, the strip 1 may be disposed in orientations different to that shown in FIGS. 1A-D. In an earlier fabrication state (not shown), mold structure 32 is applied over the lower-facing side 22 of the substrate panel 2. For each one of the electronic packages 10, an electronic component 4 is mounted to the upper-facing side 21 of the substrate panel 2. For each of the electronic packages 10, an array of solder balls 5 is arranged on the upper-facing side 21 of the substrate panel 2. The array of solder balls 5 substantially surrounds the electronic component 4. Each of the solder balls 5 is coupled to a corresponding electrically conductive pad (not shown) provided on the substrate panel 2. The electrically conductive pads form part of an electrically conductive pathway of the substrate panel 2 to one or more electronic components mounted on the substrate panel 2, such as electronic component 4.

Figure 1B:
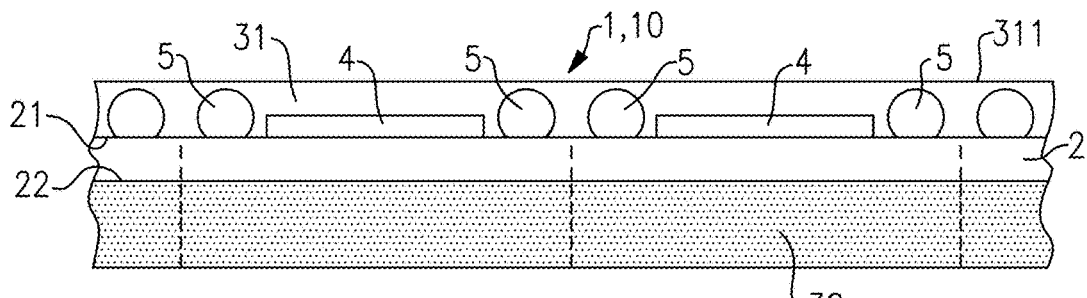

FIG. 1B shows a subsequent fabrication state to that illustrated in FIG. 1A. In the fabrication state illustrated in FIG. 1B a mold structure 31 is applied over the upper-facing side 21 of the substrate panel 2 to encapsulate the array of solder balls 5 and the electronic component 4 for each of the electronic package units 10 of the strip 1. The application of the mold structure 31 to the substrate panel 2 results in the solder balls 5 and the electronic component 4 being embedded beneath a planar outer surface 311 of the mold structure 31.

Figure 1C:
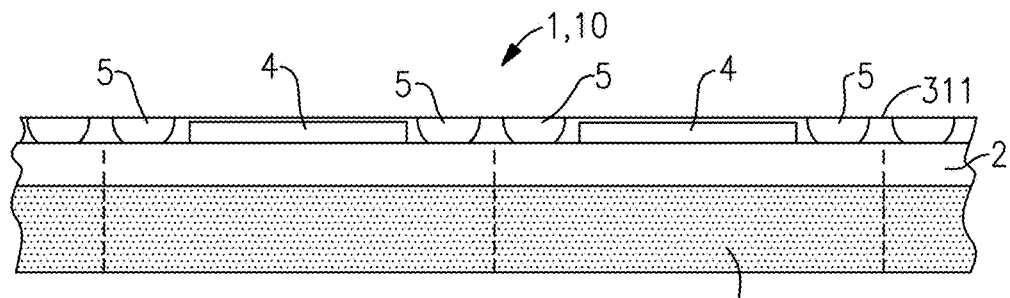

FIG. 1C shows a subsequent fabrication state to that illustrated in FIG. 1B. In the fabrication state illustrated in FIG. 1C a grinding operation is performed on the planar outer surface 311 of the mold structure 31 to remove material from the mold structure and expose the solder balls 5. However, the grinding operation also removes some of the material of the solder balls 5 and may also deform the solder balls 5 from their initial spherical state.

Figure 1D:
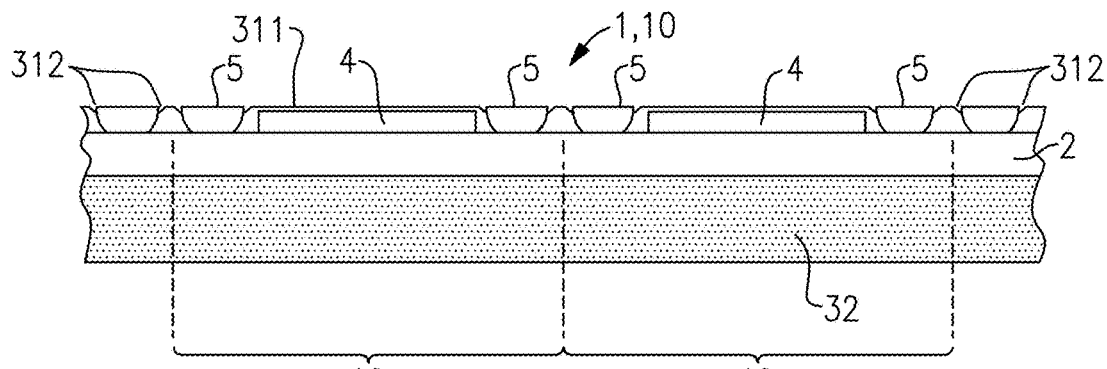

FIG. 1D shows a subsequent fabrication state to that illustrated in FIG. 1C. In the fabrication state illustrated in FIG. 1D a moat or channel 312 is formed around each of the solder balls 5 by ablating material from the mold structure 31. The ablating operation may also remove some of the material of the solder balls 5 and/or deform the solder balls 5. The moat or channel 312 provides a reservoir for receiving volatile components evolved from the respective solder ball 5 during subsequent soldering to a separate circuit board. However, the incorporation of the moat or channel 312 increases the pitch or spacing between adjacent ones of the solder balls 5. The mechanical interface between the array of solder balls 5 and the respective electrically conductive pads provided on the substrate panel 2 may also define a region vulnerable to cracking when individual ones of the electronic package units 10 are subjected to impact forces during validation testing (which may include one or more drop tests), transportation, or during operational use.

In a subsequent fabrication state (not shown), individual ones of the electronic packages 10 are separated from the strip 1 along the dashed lines indicated in FIGS. 1A-1D, thereby forming a discrete electronic package 10.

Electronic Package And Features Thereof

Figure 2:
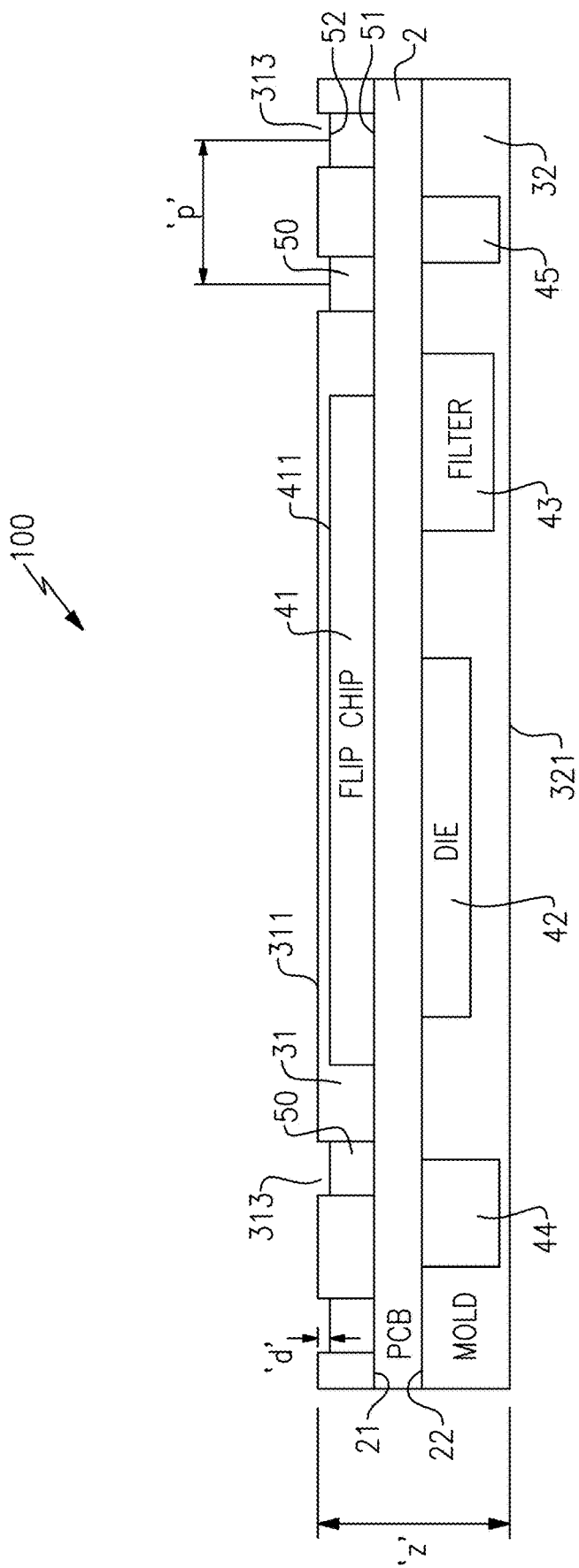
FIG. 2 is a cross-sectional schematic view of a first example of an electronic package according to aspects of the present disclosure.

FIG. 2 shows a cross-sectional schematic view of a first example of an electronic package 100 according to aspects of the present disclosure. The electronic package 100 has a substrate panel 2 which is generally planar in form. The substrate panel 2 may have a laminate construction. The substrate panel 2 may include a ceramic substrate. The ceramic substrate may include a low temperature co-fired ceramic substrate. However, it will be appreciated that other materials may be used to form the substrate panel 2. The substrate panel 2 has opposed first and second sides 21, 22.

A flip chip 41 is mounted to the first side 21 of the substrate panel 2 by an arrangement of solder balls (not shown).

A group of through-mold connections 50 substantially surround the flip chip 41. For the example shown in FIG. 2, the through-mold connections 50 are optionally solid cylindrical pillars formed of copper. However, it will be appreciated that the group of through-mold connections 50 may instead be formed from any other suitable non-reflowable electrically conductive material. By way of example and without limitation, nickel, silver and gold are examples of other suitable candidate materials for the non-reflowable electrically conductive material of the through-mold connections 50. By "non-reflowable electrically conductive material" is meant an electrically conductive material whose melting point is less than the temperature required to reflow a solder material. Copper, nickel, silver and gold have melting points of 1084 degrees Celsius, 1453 degrees Celsius, 961 degrees Celsius and 1063 degrees Celsius respectively. In contrast, known solder materials begin to reflow at temperatures of anywhere between around 90 and around 400 degrees Celsius, dependent on their composition.

Figure 3:
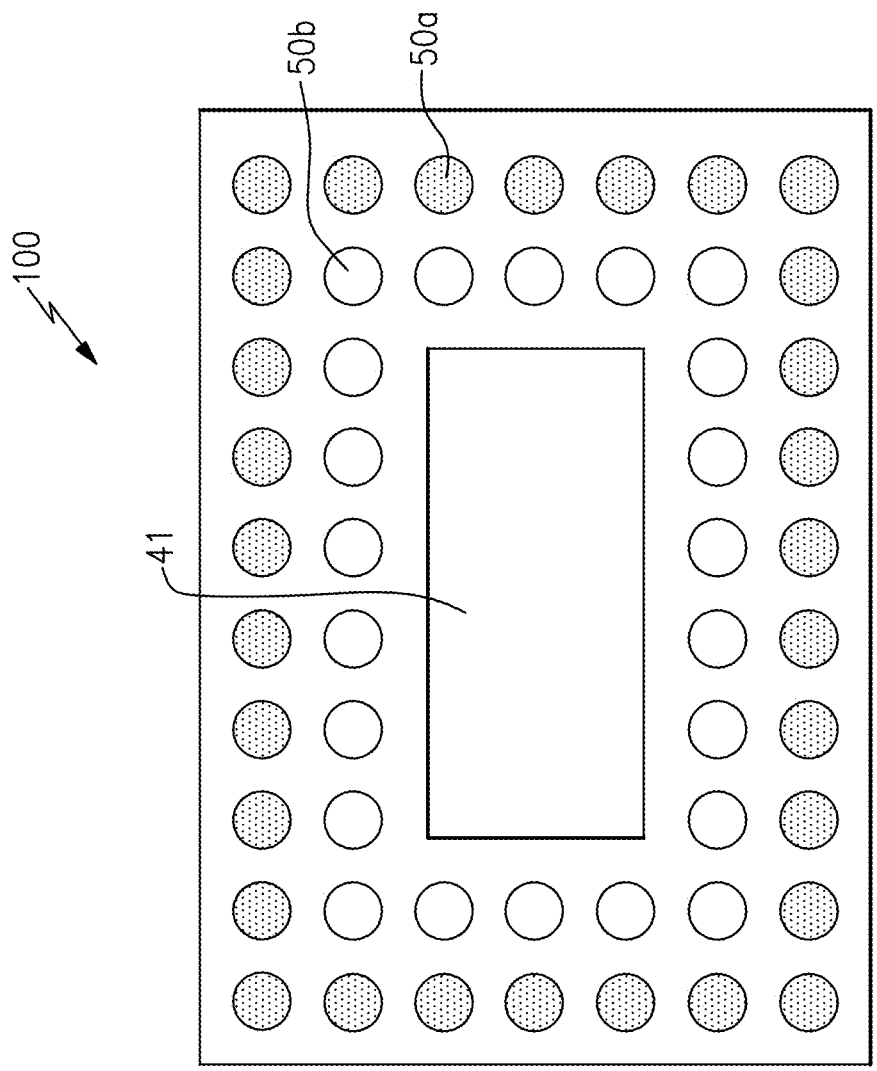
FIG. 3 is a plan schematic view of the electronic package of FIG. 2.

FIG. 3 shows a plan schematic view of the electronic package 100 of FIG. 2. As shown in FIG. 3, the group of through mold-connections 50 are arranged in a rectangular pattern around the flip chip 41 in first and second sub-groups 50a, 50b. The first sub-group 50a of through-mold connections 50 surrounds the second sub-group 50b of through-mold connections. The rectangular arrangement of first and second sub-groups 50a, 50b of through-mold connections 50 corresponds to the rectangular profile of the flip chip 41. However, it will be appreciated that the profile and area enclosed by the group of through-mold connections 50 may vary according to the size of the electronic component(s) (for example, flip chip 41) enclosed by the group of through-mold connections.

A first mold structure 31 extends over the first side 21 of the substrate panel 2. The first mold structure 31 is optionally formed from an epoxy material. However, it will be appreciated that other materials may instead be used to form the first mold structure 31. The first mold structure 31 substantially encapsulates the group of through mold-connections 50 and defines a generally planar outer surface 311. In the example shown in FIG. 2, the group of through-mold connections 50 are exposed by corresponding wells 313 defined in the first mold structure 31. For the example shown in FIG. 2, each of the group of through-mold connections 50 has a corresponding well 313. Each of the pillars which form the group of through-mold connections 50 has opposed first and second end faces 51, 52. The first end face 51 is coupled to an electrically conductive node (not shown) defined on or within the substrate panel 2. Each of the pillars of the group of through-mold connections 50 extends away from the first side 21 of the substrate panel 2. The second end face 52 of each pillar of the group of through-mold connections 50 is exposed by and recessed within the respective well 313 so as to be visible. Each well 313 is circular in plan with a cross-sectional area which is uniform along the depth 'd' of the well. The cross-sectional area of the well 312 is substantially the same as the area of the exposed end face 52 of each of the pillars which form the group of through-mold connections 50. In an alternative embodiment to that of FIG. 2, each of the group of through-mold connections 50 is substantially flush with the outer surface 311 of the first mold structure 31.

As can be seen in FIG. 2, the outer surface 311 of the first mold structure 31 is free of any moat or channel circumscribing and adjacent to each of the through-mold connections 50. The lack of any such moat or channel may allow closer spacing of adjacent ones of the through-mold connections 50. Adjacent ones of the through-mold connections 50 may have a pitch spacing 'p' of between about 300 micrometers and about 450 micrometers. The electronic package 100 may have a thickness 'z' in a range of about 0.6 millimetres to about 0.8 millimetres.

In the example shown in FIG. 2, the flip chip 41 is embedded beneath the planar outer surface 311 of the first mold structure 31. However, it will be appreciated that in other embodiments an outer surface 411 of the flip chip 41 may be exposed through the first mold structure 31. By way of example and without limitation, in some alternative embodiments the outer surface 411 of the flip chip 41 may be substantially flush with the planar outer surface 311 of the first mold structure 31.

In the electronic package 100 of FIG. 2, a semiconductor die 42 is mounted to the second side 22 of the substrate panel 2 by use of an array of solder balls (not shown). However, it will be appreciated that in alternative embodiments other forms of surface mounting technology may be used to mount the semiconductor die 42 to the substrate panel 2, such as wire bonding. A filter 43 and other electronic components 44, 45 are also mounted to the second side 22 of the substrate panel 2 by any suitable form of surface mounting technology. A second mold structure 32 extends over the second side 22 of the substrate panel 2. In common with the first mold structure 31, the second mold structure 32 is optionally formed from an epoxy material. The semiconductor die 42, filter 43 and other electronic components 44, 45 are fully encapsulated beneath an outer surface 321 of the second mold structure 32.

The first and second mold structures 31, 32 may help to protect the electronic components (such as flip chip 41, semiconductor die 42, filter 43) mounted to the substrate panel 2 from impact loads encountered during validation testing, transportation or operational use. Impact loads may be dissipated throughout the first and second mold structures 31, 32, thereby helping to reduce the forces encountered by the electronic components.

Figure 4:
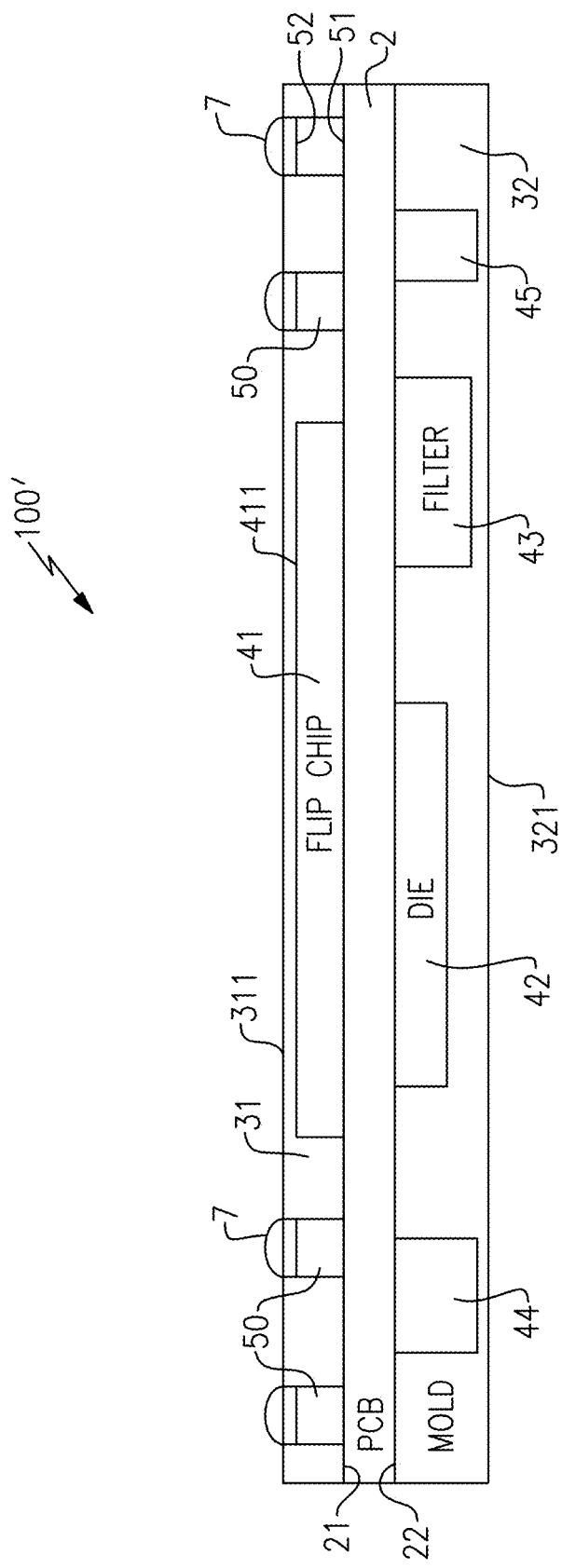
FIG. 4 is a cross-sectional schematic view of a second example of an electronic package according to aspects of the present disclosure.

FIG. 4 shows a cross-sectional view of a second example of an electronic package 100'. Features in common with the electronic package 100 illustrated in FIG. 2 are represented by the same reference signs. The electronic package 100' of FIG. 4 differs from the electronic package 100 of FIG. 2 in that a portion of solder 7 is coupled to the exposed end face 52 of each of the pillars which form the group of through-mold connections 50. In the example shown in FIG. 4, the solder portion 7 protrudes from the outer surface 311 of the first mold structure 31. However, it will be appreciated that in other embodiments, the solder portion 7 may be substantially flush with the outer surface 311 of the first mold structure 31.

As can be seen in FIG. 4, the outer surface 311 of the first mold structure 31 is free of any moat or channel circumscribing and adjacent to each of the through-mold connections 50. The lack of any such moat or channel may allow closer spacing of adjacent ones of the through-mold connections 50, in a similar manner to as described above in relation to the example of FIG. 2.

The electronic packages 100, 100' illustrated in FIGS. 2 to 4 may be referred to as a double-sided (DS) package, by virtue of electronic components (such as flip chip 41, semiconductor die 42, filter 43) being mounted to opposing sides 21, 22 of the substrate panel 2.

Figure 5:
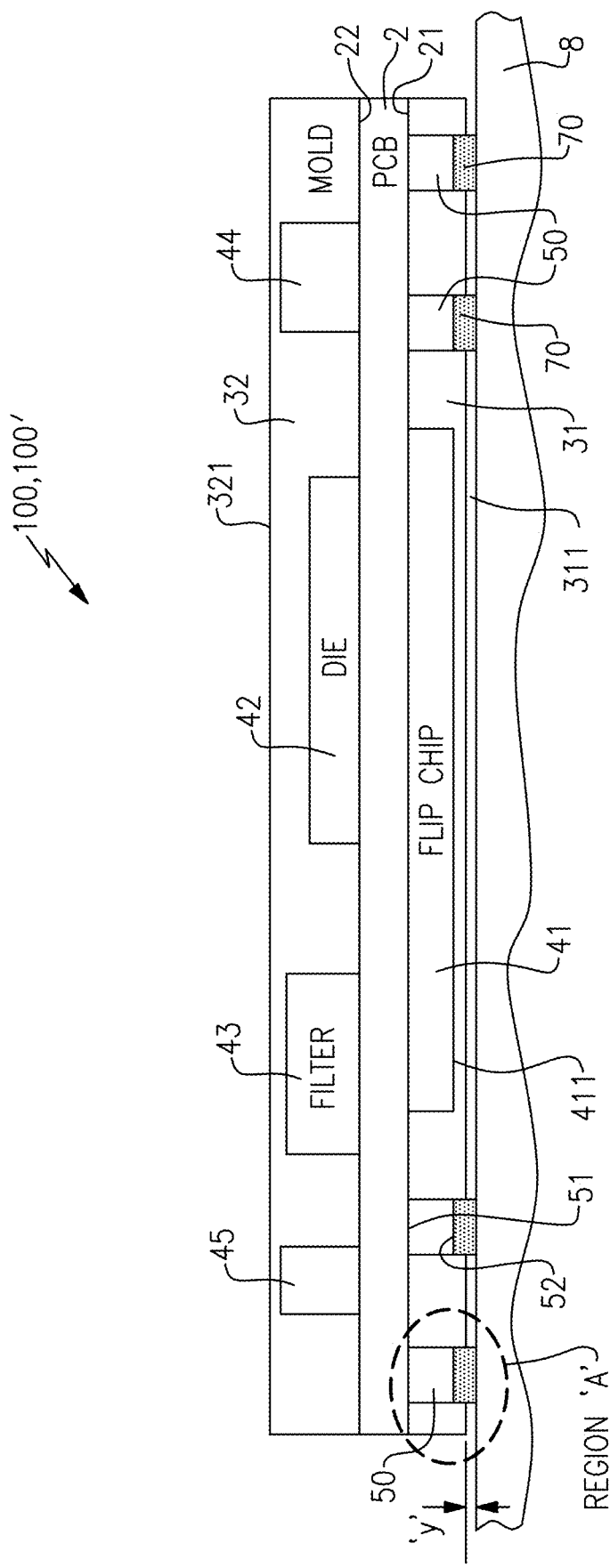
FIG. 5 is a cross-sectional schematic view of the electronic package of FIG. 2 or 4 when mounted to a circuit board of an electronic device.

The electronic package 100, 100' of FIGS. 2 and 4 may be supplied to a customer for mounting to a circuit board, such as circuit board 8 shown in FIG. 5. As will be discussed in more detail in subsequent paragraphs of this disclosure, the circuit board 8 may itself form part of an electronic device, such as a wireless device. By way of example and without limitation, the wireless device may take the form of a mobile phone, a tablet computer, a smart watch and a laptop computer.

FIG. 5 shows a cross-sectional view of the electronic package 100, 100' when coupled to the circuit board 8. The electronic package 100, 100' is shown inverted relative to the views of FIGS. 2 and 4. The electronic package 100, 100' is coupled to the circuit board 8 by use of solder 70 to couple the second end face 52 of each of the pillars which form the group of through-mold connections 50 to corresponding mounting locations on the circuit board 8. For the electronic package 100' of FIG. 4, the portions of solder 7 correspond to the solder 70. The electronic package 100, 100' is mounted to the circuit board 8 to leave a clearance 'y' between the outer surface 311 of the first mold structure 31 and the circuit board 8. The clearance 'y' may help to protect the flip chip 41 from damage due to loads imparted by flexing or dropping. Where the flip chip 41 is embedded beneath the outer surface 311 of the mold structure 31 (as shown in FIGS. 2 and 4), the material of the first mold structure 31 between the outer surface 311 and the outer surface 411 of the flip chip 41 may provide additional protection to the flip chip from loads imparted by flexing or dropping of the electronic package 100, 100'. It will be appreciated that the second mold structure 32 encapsulating semiconductor die 42, filter 43 and the other electronic components 44, 45 may provide similar protection to these components from flexing or dropping.

Once the electronic package 100, 100' is coupled to the circuit board 8, each of the group of through-mold connections 50 provides an electric conductive pathway between the electronic package 100, 100' and the circuit board 8. Further, the group of through-mold connections 50 may also provide a thermal conductive pathway for passage of heat between the electronic package 100, 100' and the circuit board 8.

Figure 6A:
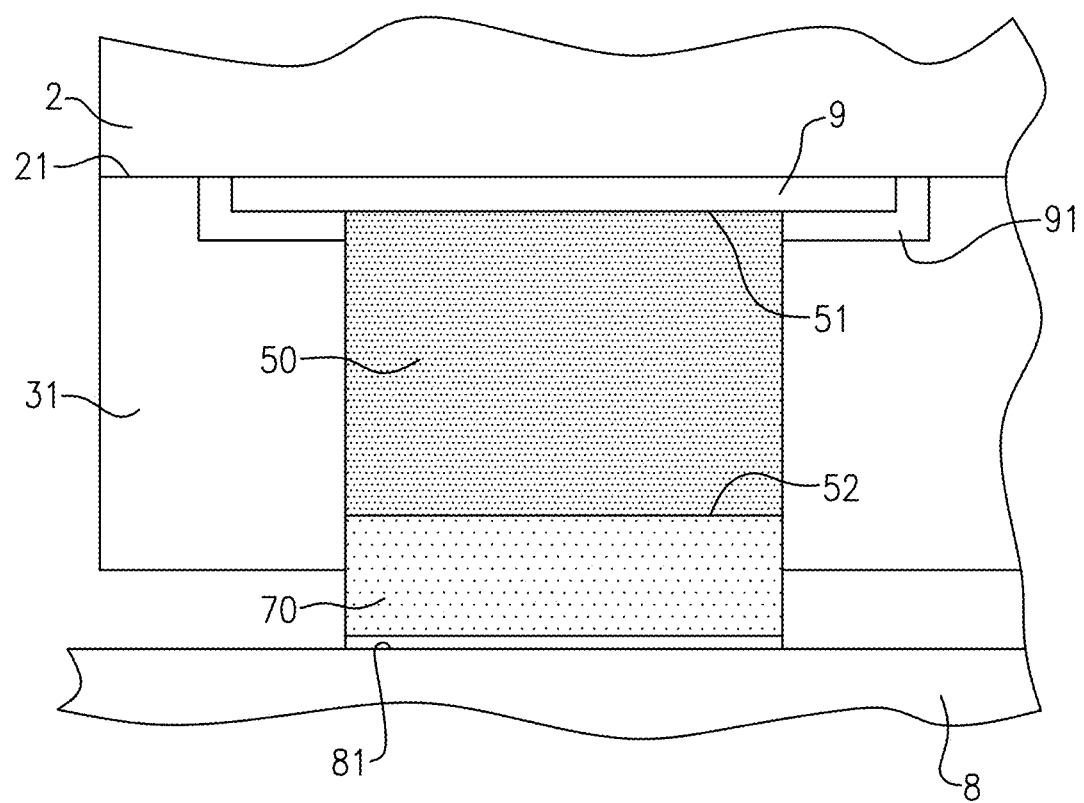
FIGS. 6A and 6B are detail schematic views of region 'A' of the electronic package mounted to a circuit board shown in FIG. 5, illustrating two examples of coupling a through-mold connection to a substrate panel of the electronic package.
Figure 6B:
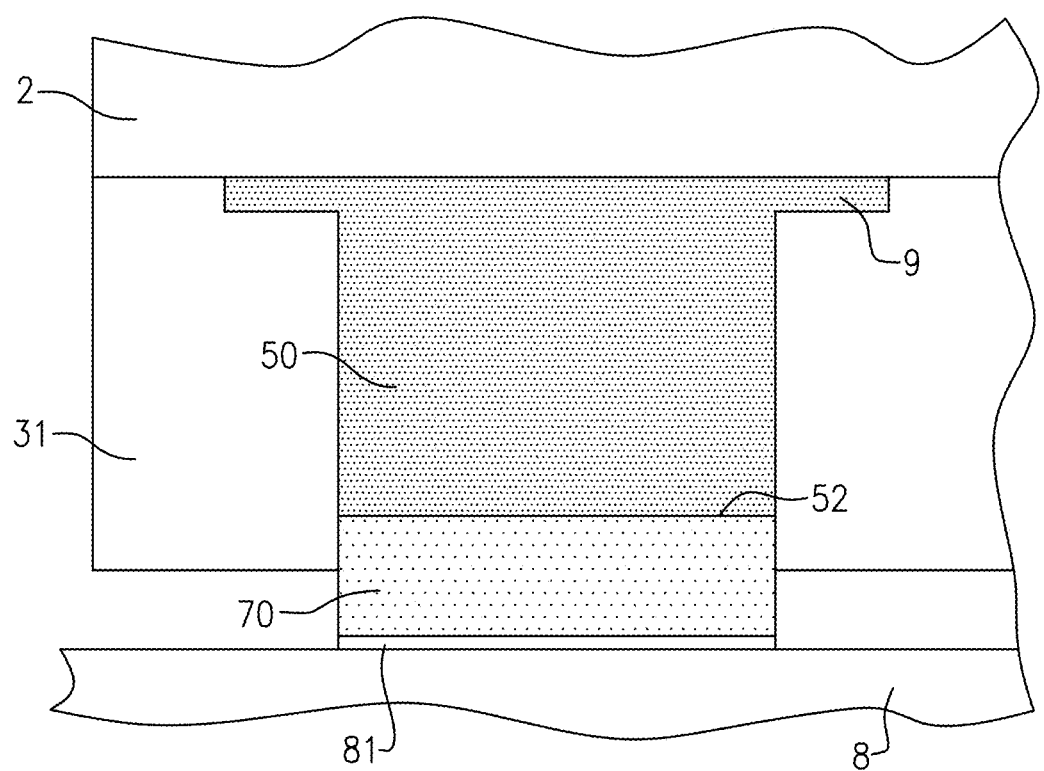

FIGS. 6A and 6B show a detail schematic view of Region 'A' (see FIG. 5) of the electronic package 100, 100' when inverted and coupled to the circuit board 8, with each figure illustrating an alternative embodiment as to how the group of through-mold connections 50 may be mounted to the first side 21 of the substrate panel 2.

As illustrated in FIG. 6A, an electrically conductive pad 9 is mounted to the first side 21 of the substrate panel 2. Solder mask 91 may circumscribe the pad 9. The through-mold connection 50 is mounted on the electrically conductive pad 9, with the solder mask 91 coupling the through-mold connection to the pad. More specifically, the first end face 51 of the pillar which forms the through-mold connection 50 is mounted to the electrically conductive pad 9. The electrically conductive pad 9 is optionally formed of copper and helps to provide an electrically conductive interface or node between the electronic package 100, 100' and the circuit board 8. However, it will be appreciated that the electrically conductive pad 9 may be formed from any other suitable material providing a desired level of electrical and/or thermal conductivity. The circuit board 8 similarly includes an electrically conductive pad 81. The solder 70 serves to couple the through-mold connection 50 (via second end face 52) to the electrically conductive pad 81. In this manner, the electronic package 100, 100' is physically and electrically connected to the circuit board 8.

FIG. 6B differs from the embodiment of FIG. 6A in that the electrically conductive pad 9 is integrally formed with the respective through-mold connection 50 as a single piece. So, in the embodiment shown, the need for a mechanical interface or joint between the through-mold connection 50 and electrically conductive pad 9 is dispensed with. The integration of the electrically conductive pad 9 and through-mold connection 50 as a single piece may provide improved performance during validation testing, such as drop tests, compared to the use of a soldered or other mechanical interface between pad 9 and through-mold connection 50.

Although not shown in the figures, the substrate panel 2 includes electrically conductive pathways between the electrically conductive pad 9 and the various electronic components mounted to the substrate panel 2, such as flip chip 41, semiconductor die 42, filter 43, and other electronic components 44, 45. By way of example, the substrate panel 2 may be a printed circuit board comprising an arrangement of vias and/or conductive tracks.

Exemplary Shapes and Profiles of Through-mold Connections

Figure 7D:
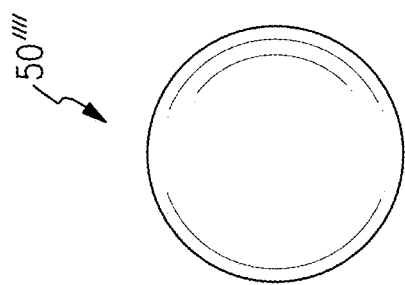
FIGS. 7A-D are perspective schematic views of alternative configurations of through-mold connections.
Figure 7C:
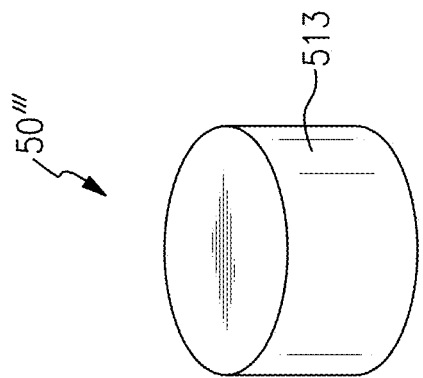
Figure 7B:
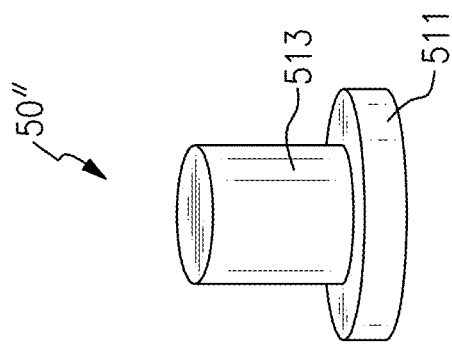
Figure 7A:
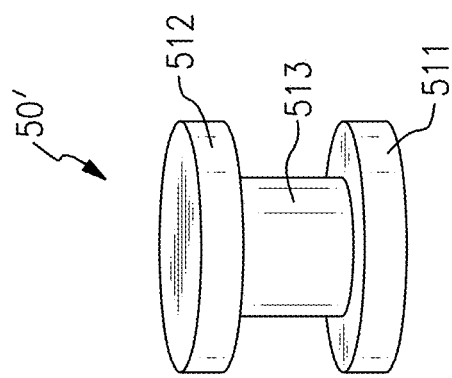

FIG. 7A-D illustrate various examples of different configurations for the through-mold connections 50. FIG. 7A illustrates a through-mold connection 50' resembling an I-section, with first and second flanges 511, 512 disposed on opposed ends of an interconnecting pillar 513. The first and second flanges 511, 512 and interconnecting pillar 513 are integrally formed as a single piece from copper or another suitable non-reflowable electrically conductive material (as discussed above). FIG. 7B illustrates a through-mold connection 50" resembling a T-section, with a first flange 511 disposed on one end of pillar 513. The first flange 511 and pillar 513 are integrally formed as a single piece from copper or another suitable non-reflowable electrically conductive material (as discussed above). FIG. 7C illustrates a through-mold connection 50''' corresponding to that shown and described with reference to the embodiments of FIGS. 2 and 4, in the form of a solid cylindrical pillar 513 formed from copper or another suitable non-reflowable electrically conductive material (as discussed above). FIG. 7D illustrates a through-mold connection 50'''' which is generally spheroidal in shape formed from copper or another suitable non-reflowable electrically conductive material (as discussed above). It will be appreciated that through-mold connections having profiles different to those illustrated in FIGS. 7A-D may also be employed.

Methods for Manufacturing Electronic Packages

FIGS. 8A-8F illustrate examples of fabrication steps 1001, 1002, 1003, 1004, 1005, 1006 for use in manufacturing an electronic package, such as electronic package 100, 100'. For the examples shown in these figures, in preceding steps (not shown) electronic components in the form of semiconductor die 42, filter 43, and other electronic components 44, 45 are mounted to the second side 22 of the substrate panel 2. The die 42 is mounted by an array of solder balls (not shown), and the filter 43 and other electronic components 44, 45 mounted by any suitable means of surface mounting technology, such as wire bonding. The second mold structure 32 is applied over the second side 22 of the substrate panel 2 to encapsulate the semiconductor die 42, filter 43 and other electronic components 44, 45 beneath outer surface 321 of the second mold structure 32. However, it will be appreciated that in other embodiments, the mounting of the semiconductor die 42, filter 43 and other electronic components 44, 45 to the second side 22 of the substrate panel 2 and the application of the second mold structure 32 may be performed after the fabrication steps illustrated in FIGS. 8A-8F.

FIG. 8A illustrates a fabrication step 1001 in which the substrate panel 2 is provided. As described in the preceding paragraph, for the embodiment shown in FIG. 8A the substrate panel 2 is provided with the semiconductor die 42, filter 43 and other electronic components 44, 45 having previously been mounted to the substrate panel 2 and encapsulated within the second mold structure 32.

FIG. 8B illustrates a fabrication step 1002 in which the group of through-mold connections 50 are arranged on the first side 21 of the substrate panel 2. The group of through-mold connections 50 are provided as a group of cylindrical pillars formed of copper or another electrically conductive non-reflowable material, as previously described. As previously described, each of the pillars of the through-mold connections 50 has opposed first and second end faces 51, 52. Each of the pillars which form the through-mold connections 50 is arranged with the first end face 51 mounted to the first side 21 of the substrate panel 2, with the pillar extending away from the first side of the panel. The group of through-mold connections 50 may be coupled to an electrically conductive pad 9, or the through-mold connections 50 integrally formed with a respective electrically conductive pad 9 as a single piece—as described above in relation to FIGS. 6A and 6B. The electrically conductive pad 9 is not shown in any of FIGS. 8A-8F.

FIG. 8C illustrates a fabrication step 1003 in which the flip chip 41 is mounted to the first side 21 of the substrate panel 2 by use of an array of solder balls (not shown).

FIG. 8D illustrates a fabrication step 1004 in which a first mold structure 31 is applied over the first side 21 of the substrate panel 2 to encapsulate the group of through-mold connections 50 and the flip chip 41. In this fabrication step 1004, the outer surface 411 of the flip chip 41 is embedded beneath the outer surface 311 of the first mold structure 31.

FIG. 8E illustrates a fabrication step 1005 in which a portion of the first mold structure 31 is removed to form a well 313 in the first mold structure 31 at the location of each of the group of through-mold connections 50. The second end face 52 of each of the pillars which form the through-mold connections 50 is exposed by and recessed within the well 313, so that the second end face 52 is visible when looking into the well. Laser ablation or a similar process may be employed to locally remove material of the first mold structure 31 to form each well 313 and thereby expose the through-mold connections 50. Completion of this fabrication step 1005 results in an electronic package 100 corresponding to that shown in FIG. 2.

FIG. 8F illustrates a fabrication step 1006 in which a portion of solder 7 is coupled to the second end face 52 of each of the pillars which form the group of through-mold connections 50. The portion of solder 7 protrudes from the outer surface 311 of the first mold structure 31. The portion of solder 7 may facilitate subsequent coupling of the electronic package to a circuit board, such as the circuit board 8 as previously described. Completion of this fabrication step 1006 results in an electronic package 100' corresponding to that shown in FIG. 4.

It will be appreciated that the fabrication step 1003 may precede or be performed substantially simultaneously with fabrication step 1002.

FIGS. 9A-9E illustrate other examples of fabrication steps 1001', 1002', 1003', 1004', 1005' for use in the manufacture of an electronic package 100'''. The fabrication steps 1001', 1002', 1003' and 1004' of FIGS. 9A-D correspond to steps 1001, 1002, 1003 and 1004 respectively of FIGS. 8A-D. However, fabrication step 1005' illustrated in FIG. 9E differs from fabrication step 1005 of FIG. 8E in that the entire planar outer surface 311 of the first mold structure 31 is abraded by grinding or a similar process to progressively remove a thin layer of material from the outer surface of the first mold structure 31 such that, on completion of the abrading step, the planar outer surface 311 of the first mold structure 31 is substantially flush with the second end face 52 of the group of through-mold connections 50.

The electronic package 100, 100', 100'' resulting from the fabrication steps described in relation to FIGS. 8A-F and 9A-E may be coupled to the circuit board 8 as previously described.

In other embodiments, a conformal shielding layer (not shown) may be provided to overlie either or both of the first mold structure 31 and the second mold structure 32. The shielding layer defines an electromagnetic interference shield for the electronic package 100, 100', 100''.

Exemplary Components Mounted to Substrate Panel of Electronic Package

Figure 10:
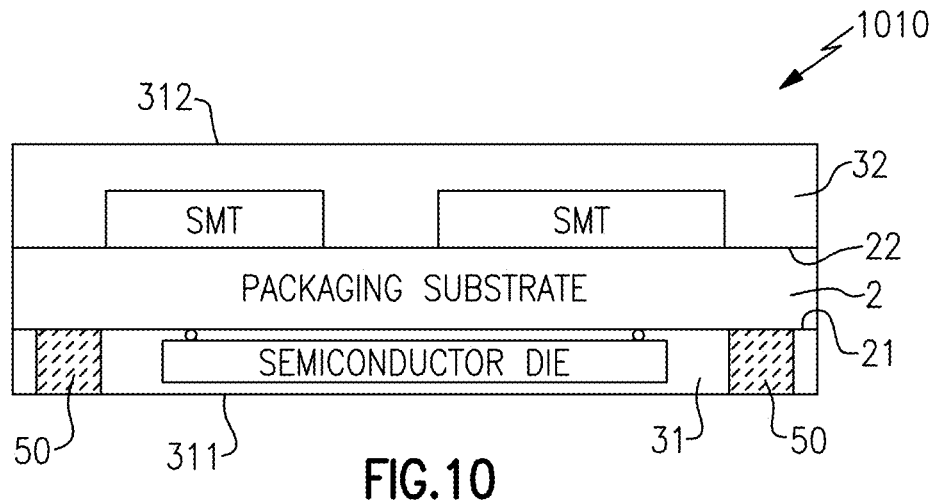
FIG. 10 illustrates an electronic package having one or more surface mount technology devices mounted on a substrate panel, according to aspects of the present disclosure.
Figure 11:
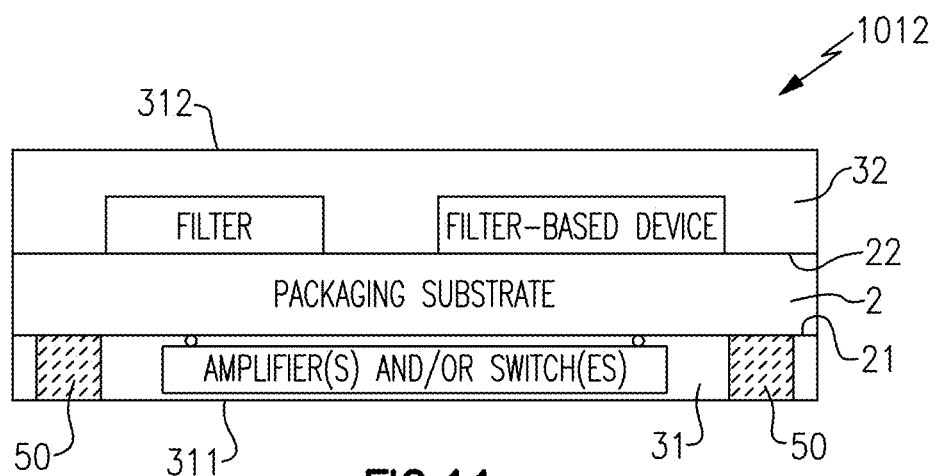
FIG. 11 illustrates a further electronic package having one or more surface mount technology devices mounted on a substrate panel, according to aspects of the present disclosure.
Figure 12:
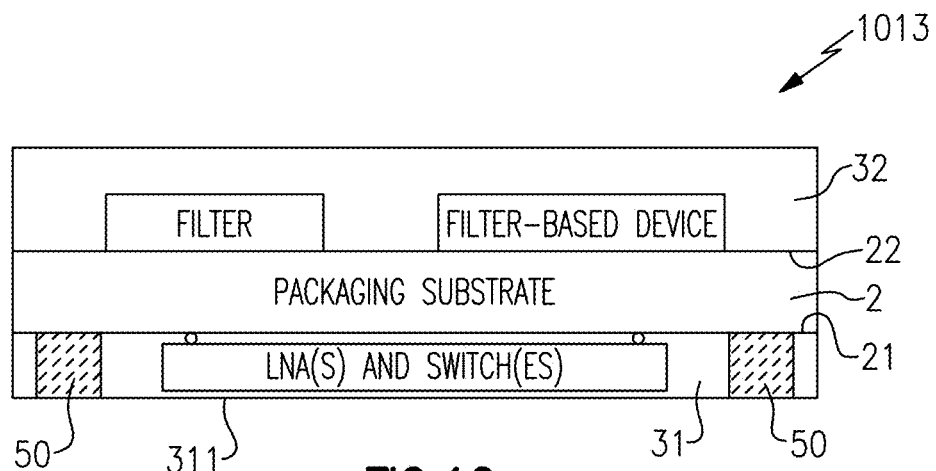
FIG. 12 illustrates a further electronic package having one or more surface mount technology devices mounted on a substrate panel, according to aspects of the present disclosure.

As will be appreciated, the electronic package 100, 100', 100'' illustrated and described above may employ a variety of different electronic components mounted to the substrate panel 2. By way of example, FIG. 10 shows an embodiment of a double-sided electronic package 1010 in which a semiconductor die is mounted to the first side 21 of the substrate panel 2 by an array of solder balls, with other electronic components mounted to the second side 22 of the substrate panel by any suitable surface mount technology. By way of further example, FIG. 11 shows an embodiment of a double-sided electronic package 1012 in which one or more amplifiers and/or switches are mounted to the first side 21 of the substrate panel 2 and a filter/filter-based device mounted to the second side 22 of the substrate panel. By way of further example, FIG. 12 shows an embodiment of a double-sided electronic package 1013 in which one or more low noise amplifier (LNA) modules and switches are mounted to the first side 21 of the substrate panel 2 and a filter/filter-based device mounted to the second side 22 of the substrate panel.

Exemplary Devices Incorporating Electronic Package

Figure 13:
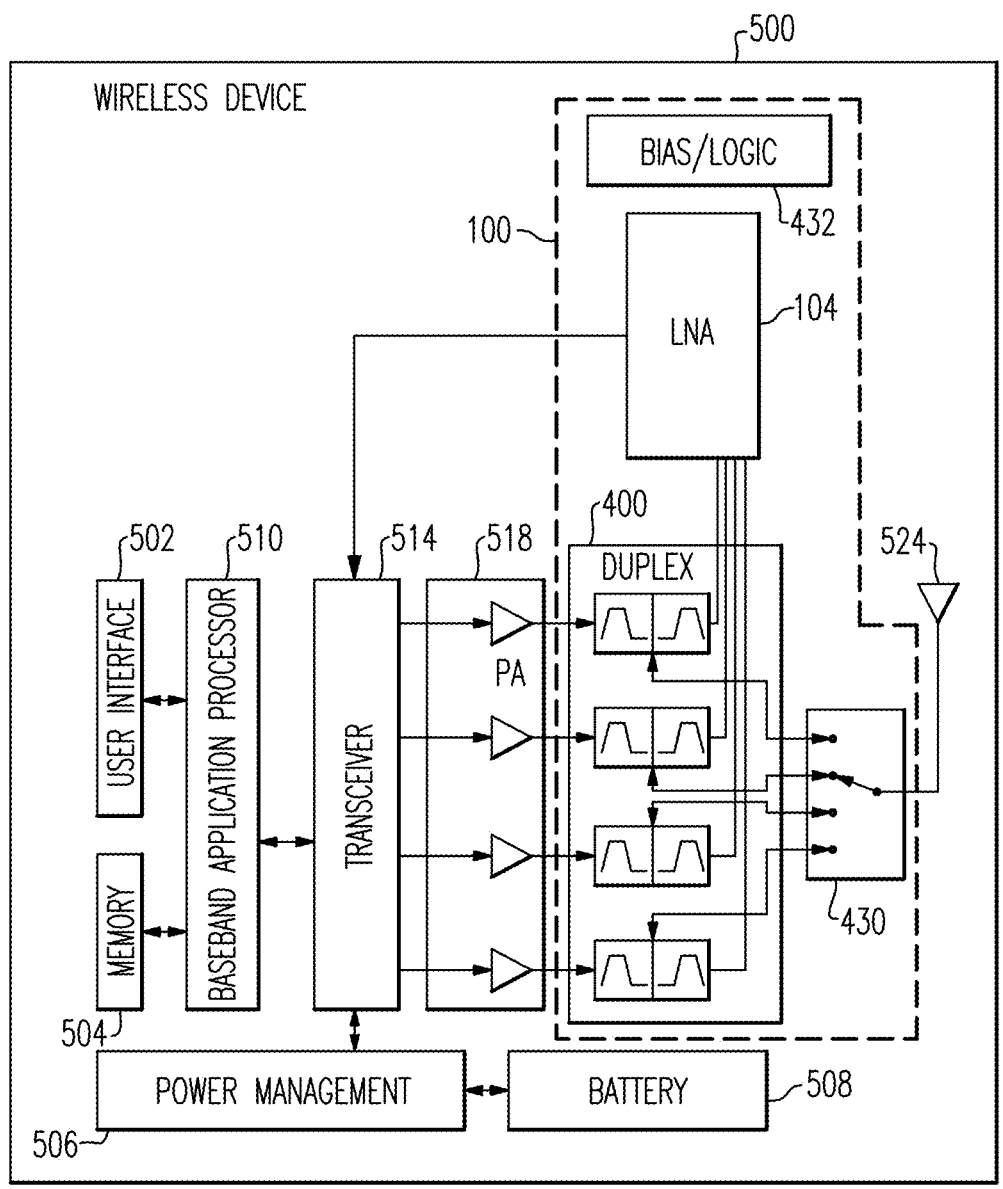
FIG. 13 illustrates an electronic package implemented in a wireless device, according to aspects of the present disclosure.

FIG. 13 illustrates an example of how a dual-sided electronic package 100 may be implanted in an electronic device, such as wireless device 500. In the example wireless device 500 of FIG. 13, the electronic package 100 may be an LNA or LNA-related module -represented by the dashed outline in FIG. 13. By way of example, the LNA module 100 may include one or more LNA's 104, a bias/logic circuit 432, and a band-selection switch 430. Some or all of such circuits can be implemented in a semiconductor die that is mounted on a substrate panel 2 of the LNA module 100. In such an LNA module, some or all of duplexers 400 can be mounted on the substrate panel 2 so as to form a dual-sided package having one or more features as described herein.

FIG. 13 further depicts various features associated with the example wireless device 500. Although not specifically shown in FIG. 13, the electronic package 100 may instead take the form of a diversity receive (RX) module in place of the LNA module. Alternatively, the electronic package 100 may take the form of a combination of a diversity RX module and an LNA module. It will also be understood that a dual-sided package 100 having one or more features as described herein can be implemented in the wireless device 500 as a non-LNA module.

In the example wireless device 500, a power amplifier (PA) circuit 518 having a plurality of PA's can provide an amplified RF signal to switch 430 (via duplexers 400), and the switch 430 can route the amplified RF signal to an antenna 524. The PA circuit 518 can receive an unamplified RF signal from a transceiver 514 that can be configured and operated in known manners.

The transceiver 514 can also be configured to process received signals. Such received signals can be routed to the LNA 104 from the antenna 524, through the duplexers 400. Various operations of the LNA 104 can be facilitated by the bias/logic circuit 432.

The transceiver 514 is shown to interact with a baseband subsystem 510 that is configured to provide conversion between data and/or voice signals suitable for a user and RF signals suitable for the transceiver 514. The transceiver 514 is also shown to be connected to a power management component 506 that is configured to manage power for the operation of the wireless device 500. Such a power management component can also control operations of the baseband sub-system 510.

The baseband sub-system 510 is shown to be connected to a user interface 502 to facilitate various input and output of voice and/or data provided to and received from the user. The baseband sub-system 510 can also be connected to a memory 504 that is configured to store data and/or instructions to facilitate the operation of the wireless device, and/or to provide storage of information for the user.

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

It will be noted that the figures are for illustrative purposes only, and are not to scale.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

The invention claimed is:

1. An electronic package, comprising:
    a substrate having a first side and a second side, the substrate configured to receive one or more electronic components;
    a first electronic component mounted to the first side of the substrate;
    a first mold structure extending over at least part of the first side of the substrate; and
    a group of through-mold connections provided on the first side of the substrate, the group of through-mold connections substantially formed of a non-reflowable electrically conductive material, the first mold structure substantially encapsulating the group of through-mold connections, the group of through-mold connections exposed through the first mold structure and including first and second sub-groups of through-mold connections, the second sub-group surrounding the first electronic component and the first sub-group surrounding the second sub-group, and each through-mold connection of the group of through-mold connections being individually recessed in a corresponding well defined in the first mold structure such that an exposed surface of the through-mold connection is recessed offset from a surface of the first mold structure that surrounds the through-mold connection by a depth and is exposed by the corresponding well to define the exposed surface.

2. The electronic package of claim 1 further comprising:
    a second electronic component mounted to the second side of the substrate; and
    a second mold structure extending over at least part of the second side of the substrate.

3. The electronic package of claim 1 wherein the non-reflowable electrically conductive material has a melting point of greater than 400 degrees Celsius.

4. The electronic package of claim 3 wherein the non-reflowable electrically conductive material includes or consists of any one or more of copper, nickel, gold and silver.

5. The electronic package of claim 1 wherein the non-reflowable electrically conductive material is formed of a non-solder material.

6. The electronic package of claim 1 wherein an outer surface of the first mold structure is free of any moat or channel circumscribing and adjacent to each of the group of through-mold connections.

7. The electronic package of claim 1 wherein the corresponding well has a substantially uniform cross-sectional area along a depth of the corresponding well, the substantially uniform cross-sectional area substantially the same as the area of the exposed surface of the through-mold connection.

8. The electronic package of claim 1 wherein at least one through-mold connection of the group of through-mold connections is coupled to a corresponding electrically conductive node provided on or embedded in the substrate.

9. The electronic package of claim 8 wherein the corresponding electrically conductive node includes an electrically conductive pad provided on or embedded in the substrate.

10. The electronic package of claim 9 wherein the electrically conductive pad and the at least one through-mold connection are integrally formed as a single piece from the non-reflowable electrically conductive material.

11. An electronic device, comprising:
    a circuit board configured to receive one or more electronic packages; and
    an electronic package mounted to the circuit board, the electronic package including a substrate having a first side and a second side, the substrate configured to receive one or more electronic components, the electronic package further including a first electronic component mounted to the first side of the substrate, a first mold structure extending over at least part of the first side of the substrate, and a group of through-mold connections provided on the first side of the substrate, the group of through-mold connections substantially formed of a non-reflowable electrically conductive material, the first mold structure substantially encapsulating the group of through-mold connections, the group of through-mold connections exposed through the first mold structure and including first and second sub-groups of through-mold connections, the second sub-group surrounding the first electronic component and the first sub-group surrounding the second sub-group, and each through-mold connection of the group of through-mold connections individually recessed in a corresponding well defined in the first mold structure such that an exposed surface of the through-mold connection is recessed from a surface of the first mold structure by a depth and is exposed by the corresponding well to define the exposed surface.

12. The electronic device of claim 11 wherein the one or more electronic components further include a second electronic component mounted to the second side of the substrate, and the electronic package further includes a second mold structure extending over at least part of the second side of the substrate.

13. The electronic device of claim 11 wherein the non-reflowable electrically conductive material has a melting point of greater than 400 degrees Celsius.

14. The electronic device of claim 11 wherein the non-reflowable electrically conductive material is formed of a non-solder material.

15. The electronic device of claim 11 wherein an outer surface of the first mold structure is free of any moat or channel circumscribing and adjacent to each of the group of through-mold connections.

16. The electronic device of claim 11 wherein the corresponding well has a substantially uniform cross-sectional area along a depth of the corresponding well, the substantially uniform cross-sectional area substantially the same as the area of the exposed surface of the through-mold connection.

* * * * *